US010790159B2

(12) United States Patent
Xu et al.

(10) Patent No.: US 10,790,159 B2
(45) Date of Patent: Sep. 29, 2020

(54) SEMICONDUCTOR PACKAGE SUBSTRATE WITH THROUGH-HOLE MAGNETIC CORE INDUCTOR USING CONDUCTIVE PASTE

(71) Applicant: Intel Corporation, Santa Clara, CA (US)

(72) Inventors: Cheng Xu, Chandler, AZ (US); Chong Zhang, Chandler, AZ (US); Yikang Deng, Chandler, AZ (US); Junnan Zhao, Gilbert, AZ (US); Ying Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 196 days.

(21) Appl. No.: 15/920,881

(22) Filed: Mar. 14, 2018

(65) Prior Publication Data

US 2019/0287815 A1    Sep. 19, 2019

(51) Int. Cl.
*H01L 21/48* (2006.01)
*H01F 27/28* (2006.01)
(Continued)

(52) U.S. Cl.
CPC ....... *H01L 21/486* (2013.01); *H01F 17/0006* (2013.01); *H01F 17/06* (2013.01); *H01F 27/2804* (2013.01); *H01F 41/046* (2013.01); *H01F 41/24* (2013.01); *H01L 21/6715* (2013.01); *H01L 21/67075* (2013.01);
(Continued)

(58) Field of Classification Search
CPC ................ H01F 17/0006; H01F 17/06; H01F 2017/002; H01F 2017/48; H01F 2017/065; H01F 2017/067; H01F 27/2804; H01F 41/046; H01F 41/16; H01F 41/24; H05K 1/112; H05K 1/113; H05K 1/115; H05K 1/165; H05K 3/002; H05K 3/0088; H05K 3/0094; H05K 3/4661; H01L 21/486; H01L 21/67075; H01L 21/6715; H01L 23/49822; H01L 23/49827; H01L 23/49883

See application file for complete search history.

(56) References Cited

U.S. PATENT DOCUMENTS

| 7,868,728 B2 * | 1/2011 | Mano ................... H01F 17/0006 336/200 |
| 9,257,221 B2 * | 2/2016 | Liu ...................... H01F 17/0013 |
| 9,959,964 B2 * | 5/2018 | Yun ......................... H01F 10/12 |

* cited by examiner

*Primary Examiner* — Peter Dungba Vo
*Assistant Examiner* — Joshua D Anderson
(74) *Attorney, Agent, or Firm* — Schwabe, Williamson & Wyatt, P.C.

(57) ABSTRACT

The systems and methods described herein provide for the fabrication of semiconductor package substrates having magnetic inductors formed in at least a portion of the through-holes formed in the semiconductor package substrate. Such magnetic inductors are formed without exposing the magnetic material disposed in the through-hole to any wet chemistry (desmear, electro-less plating, etc.) processes by sealing the magnetic material with a patterned sealant (e.g., patterned dry film resist) which seals the magnetic material prior to performing steps involving wet chemistry on the semiconductor package substrate. Such beneficially minimizes or even eliminates the contamination of wet chemistry reagents by the magnetic material should the magnetic material remain exposed during the wet chemistry processes. The patterned sealant is removed subsequent to the semiconductor package processing steps involving wet chemistry.

15 Claims, 7 Drawing Sheets

(51) Int. Cl.
    *H01F 41/24*     (2006.01)
    *H01L 21/67*     (2006.01)
    *H01F 17/00*     (2006.01)
    *H01F 41/04*     (2006.01)
    *H01F 17/06*     (2006.01)
    *H05K 1/16*     (2006.01)
    *H05K 3/00*     (2006.01)

(52) U.S. Cl.
    CPC ........ *H01F 2017/002* (2013.01); *H05K 1/165* (2013.01); *H05K 3/0094* (2013.01)

SEMICONDUCTOR PACKAGE SUBSTRATE WITH THROUGH-HOLE MAGNETIC CORE INDUCTOR USING CONDUCTIVE PASTE

TECHNICAL FIELD

The present disclosure relates to semiconductor packaging.

BACKGROUND

Next generation server and data center microprocessors are powered using Fully Integrated Voltage Regulators (FIVRs). The current FIVR structure includes a snake-like or serpentine air coil inductor formed by the wall conductor in a mechanical through-hole process. The addition of a magnetic material inside the coil increases the magnetic flux and improving the inductance of the coil. To improve the efficiency of the FIVRs, high density through-hole coaxial magnetic core inductors may be used.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
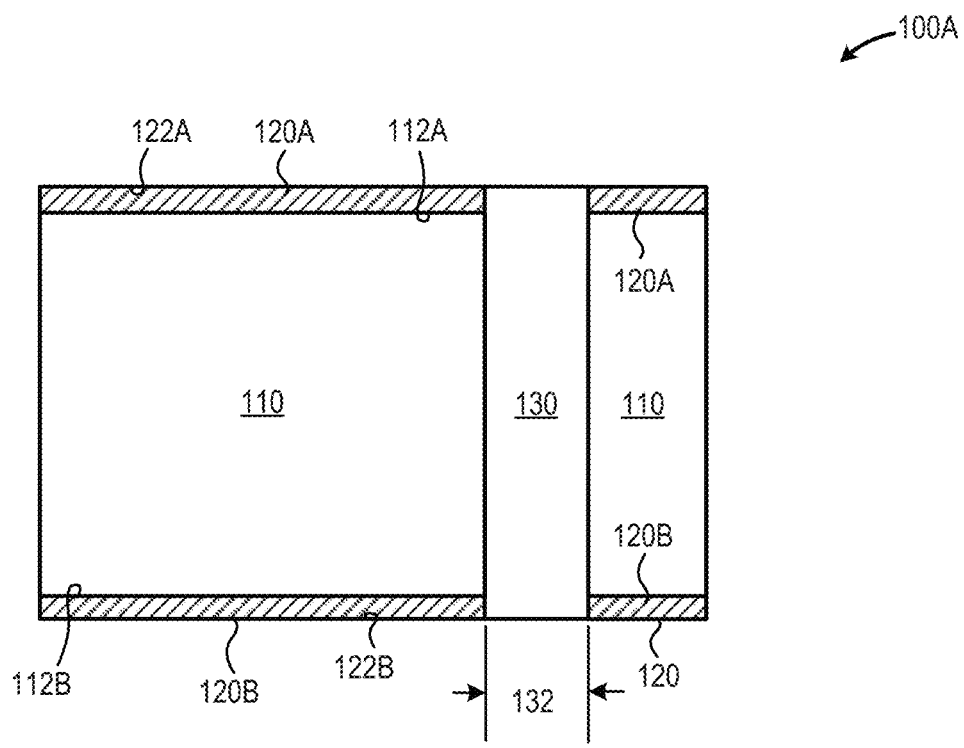
FIG. 1A is a partial cross-sectional elevation of an illustrative semiconductor package substrate preparatory to the formation of a magnetically lined through-hole, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein provide conductive paste filled magnetic core inductors in semiconductor substrates in a manner that does not require the use of wet chemistry processes on exposed magnetic material disposed in through-holes formed in the semiconductor substrate. The systems and methods described herein employ a magnetic through-hole fill material to plug relatively larger diameter through holes formed in the semiconductor package substrate. After curing the magnetic material, a relatively smaller diameter through-hole is formed in the cured magnetic material. The annular-shaped magnetic material is sealed with one or more sealants patterned on the substrate, for example using a lithographic process, such that no exposed magnetic material remains. Wet chemistry processes such as desmear, electroless plating, and wall copper plating, may then be performed on the substrate without being contaminated by exposure to the magnetic material. After the wet chemistry processes are completed, the one or more sealants are removed and additional dry processing, such as filling the smaller through-hole with an electrically conductive paste may be performed.

The systems and methods described herein beneficially permit the formation of magnetically lined and unlined through-holes in the semiconductor package substrate. Advantageously, the systems and methods described herein permit the formation of both magnetically lined and unlined through holes having the same copper layer thickness on the surface of the substrate, simplifying the connection of semiconductor dies and circuit boards to the substrate.

The magnetic material may be provided as a liquid or paste-like material suitable for filling the larger diameter through-holes in the substrate. The magnetic material may include one or more magnetically permeable materials disposed in a carrier matrix. The viscosity of the carrier matrix may determine the physical properties of the magnetic material. The carrier matrix may include one or more photochemically reactive, thermosetting, or epoxy materials that, when cured, form a solid magnetic material suitable for additional semiconductor processing.

A method of forming a through-hole lined with a magnetic material is provided. The method may include: forming a first through-hole in a substrate having an upper surface and a lower surface; forming a second through-hole in the substrate; filling the second through hole with a magnetic material such that an upper surface of the magnetic material is flush with the upper surface of the substrate and a lower surface of the magnetic material is flush with the lower surface of the substrate; forming a third through-hole in the magnetic material, the third through-hole extending from the upper surface of the magnetic material to the lower surface of the magnetic material; sealing the third through-hole on the upper surface and the lower surface of the magnetic material using a sealant that extends beyond the periphery of the second through-hole, the sealant disposed on at least a portion of an upper surface and the lower surface of the magnetic material; depositing a first metal layer on at least a portion of the substrate and in at least a portion of the first through-hole; stripping the sealant from the upper surface and the lower surface of the magnetic material to expose the magnetic material and the third through-hole; at least partially filling the third through-hole with a conductive paste that includes one or more electrically conductive materials; grinding the conductive paste; and curing the conductive paste at a temperature less than a glass transition temperature of the substrate.

A method of forming a through-hole lined with a magnetic material is provided. The method may include: forming a first through-hole having a relatively small first diameter through a substrate having an upper surface and a lower surface; depositing a magnetic material in a second through-hole having a relatively large second diameter that extends from the upper surface of the substrate to the lower surface of the substrate; forming a third through-hole through the magnetic material, the third through-hole having the relatively small first diameter; depositing a sealant proximate the third through-hole, the sealant extending beyond the periphery of the second through-hole, the sealant proximate the upper surface of the substrate and proximate the lower surface of the substrate; performing one or more wet chemistry processes on the substrate; removing the sealant; and at least partially filling the third through-hole with a conductive paste that includes one or more electrically conductive materials.

A system for forming a through-hole lined with a magnetic material is provided. The system may include: means for forming a first through-hole having a relatively small first diameter through a substrate having an upper surface and a lower surface; means for depositing a magnetic material in a second through-hole having a relatively large second diameter that extends from the upper surface of the substrate to the lower surface of the substrate; means for forming a third through-hole through the magnetic material, the third through-hole having the relatively small first diameter; means for depositing a sealant proximate the third through-hole, the sealant extending beyond the periphery of the second through-hole, the sealant proximate the upper surface of the substrate and proximate the lower surface of the substrate; means for performing one or more wet chemistry processes on the substrate; means for removing the sealant; and means for at least partially filling the third through-hole with a conductive paste that includes one or more electrically conductive materials.

FIG. 1A is a partial cross-sectional elevation of an illustrative semiconductor package substrate 100A preparatory to the formation of a magnetically lined through-hole, in accordance with at least one embodiment described herein. As depicted in FIG. 1A, the semiconductor package substrate 100A includes a substrate core 110 that may include any number of insulative and/or any number of conductive layers. One or more conductive layers 120A, 120B (collectively, "conductive layers 120") may be disposed across all or a portion of a first surface 112A and/or a second surface 112B, respectively, of the substrate core 110. Although only a single through-hole 130 is depicted for clarity and ease of discussion, any number of through-holes 130A-130n may extend from the surface 122A of the conductive layer 120A to the surface 122B of the conductive layer 120B.

The substrate core 110 may include any number and/or combination of electrically insulative, dielectric, and/or electrically conductive layers. In embodiments, the substrate core 110 may include a dielectric material having a substantially uniform thickness. In at least some embodiments, the substrate core 110 may have a thickness of: about 40 micrometers (µm) or less; about 80 µm or less; about 120 µm or less; or about 200 µm or less.

The conductive layers 120 may include any number and/or combination of electrically conductive metallic, non-metallic, and/or composite materials. Example metallic materials include, but are not limited to: copper, copper-containing alloys, aluminum, aluminum-containing alloys, silver, silver-containing alloys, gold, and gold-containing alloys. Example non-metallic materials include but are not limited to: carbon fiber, conductive polymers, such as Indium Tin Oxide (ITO), or conductive polymer mixtures. An example composite material includes but is not limited to: one or more conductive nanoparticles and/or nanowires suspended in a thermosetting or curable polymeric carrier matrix.

The conductive layers 120 may be uniformly distributed, patterned, or otherwise disposed across all or a portion of the first surface 112A and/or the second surface 112B of the substrate core 110. In embodiments, the conductive layers 120 may be deposited, patterned, or otherwise disposed on, across, or about all or a portion of the first surface 112A and the second surface 112B of the substrate core 110 using any currently available and/or future developed material deposition techniques. Example techniques include, but are not limited to: electroplating, electroless plating, sputtering, photolithographic deposition, printing, or combinations thereof. In embodiments, the conductive layers 120 may have a substantially uniform thickness. In embodiments, the thickness of the first conductive layer 120A may be the same as or different from the thickness of the second conductive layer 120B. In embodiments, the conductive layers 120 may have an average thickness of: about 5 micrometers (µm) or less; about 7 µm or less; about 10 µm or less; about 15 µm or less; about 20 µm or less; or about 30 µm or less.

The through-hole 130 may be formed through the conductive layers 120 and the substrate core 110 using any number and/or combination of currently available and/or future developed material removal processes or methods. In embodiments, the through-hole 130 may be formed mechanically, for example by drilling or mechanical abrasion. In embodiments, the through-hole 130 may be formed by ablation, for example via laser ablation. In embodiments, the through-hole 130 may be formed via etching. The through-hole 130 may have a generally uniform, relatively small, first diameter 132. In embodiments, the through-hole 130 may have a first diameter 132 of: about 10 micrometers (μm) or less; about 25 μm or less; about 40 μm or less; about 50 μm or less; or about 60 μm or less.

Figure 1B:
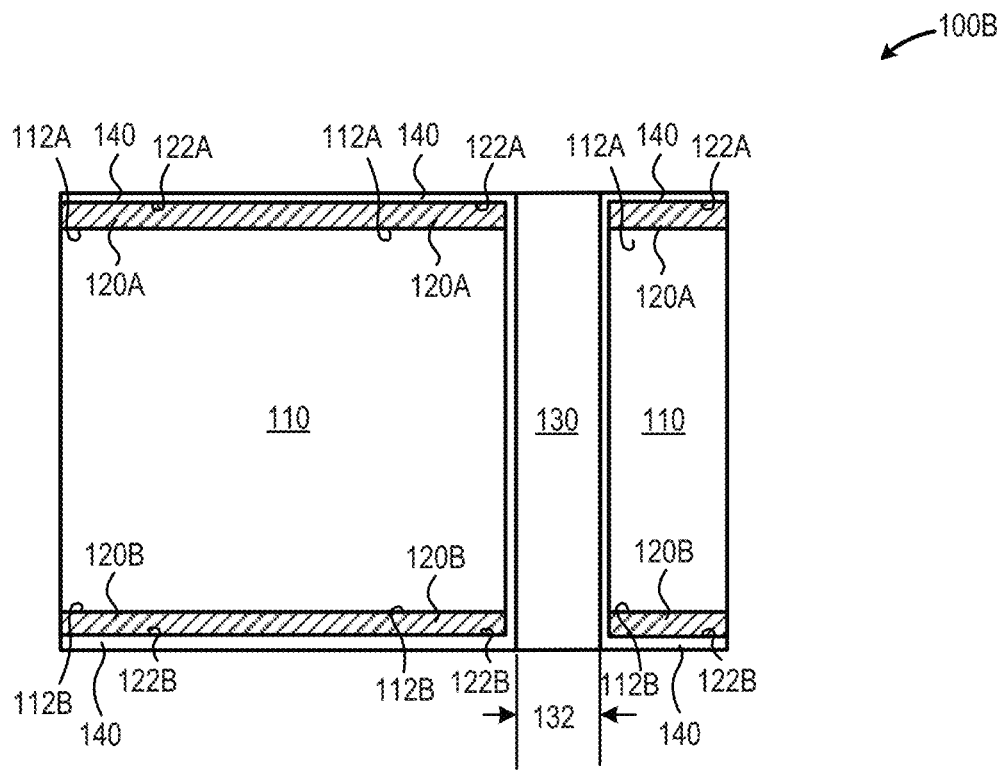
FIG. 1B depicts an illustrative semiconductor package substrate after performing a surface preparation and deposition of a seed layer across the surface of conductive layer, the surface of conductive layer, and on the interior surfaces of the through-hole, in accordance with at least one embodiment described herein.

FIG. 1B depicts an illustrative semiconductor package substrate 100B after performing a surface preparation and deposition of a seed layer 140 across the surface 122A of conductive layer 120A, the surface 122B of conductive layer 120B, and on the interior surfaces of the through-hole 130, in accordance with at least one embodiment described herein. In embodiments, a surface preparation treatment or etchback, often referred to as a "desmear," may be applied to the semiconductor package substrate 100B to prepare the surface of the semiconductor core 110 and/or the surface of the conductive layers 120 for the application of the seed layer. The surface preparation treatment roughens and cleans the interior surface of the through-hole 130 and/or the surfaces 122A, 122B of the conductive layers 120A and 120B, respectively. The surface preparation treatment may include one or more "wet chemistry" processes where the semiconductor package substrate 100B is exposed to a spray of, or immersed in a bath containing, one or more chemical compounds, for example one or more permanganate compounds, one or more caustic compounds, or combinations thereof. In some implementations, the surface preparation treatment may include one or more chemical solution baths maintained at an elevated temperature.

The seed layer 140 prepares the semiconductor package substrate 100B for the future deposition of additional conductive layers. In embodiments, the seed layer 140 may be deposited across all or a portion of the conductive layers 120 and/or all or a portion of the interior surfaces of the through-hole 130 using any number and/or combination of currently available or future developed material deposition processes or systems. In some implementations, the seed layer 140 may be deposited via one or more electroless, auto-catalytic, or chemical plating processes in which the semiconductor package substrate 100B is immersed in bath containing metal ions. The seed layer 140 may have a substantially uniform thickness across all or a portion of the conductive layers 120. The seed layer 140 may have a substantially uniform thickness across all or a portion of the interior surfaces of the through-hole 130. In embodiments, the seed layer 140 may have a thickness of: about 5 micrometers (μm) or less; about 10 μm or less; about 20 μm or less; about 50 μm or less; about 75 μm or less; or about 100 μm or less.

Figure 1C:
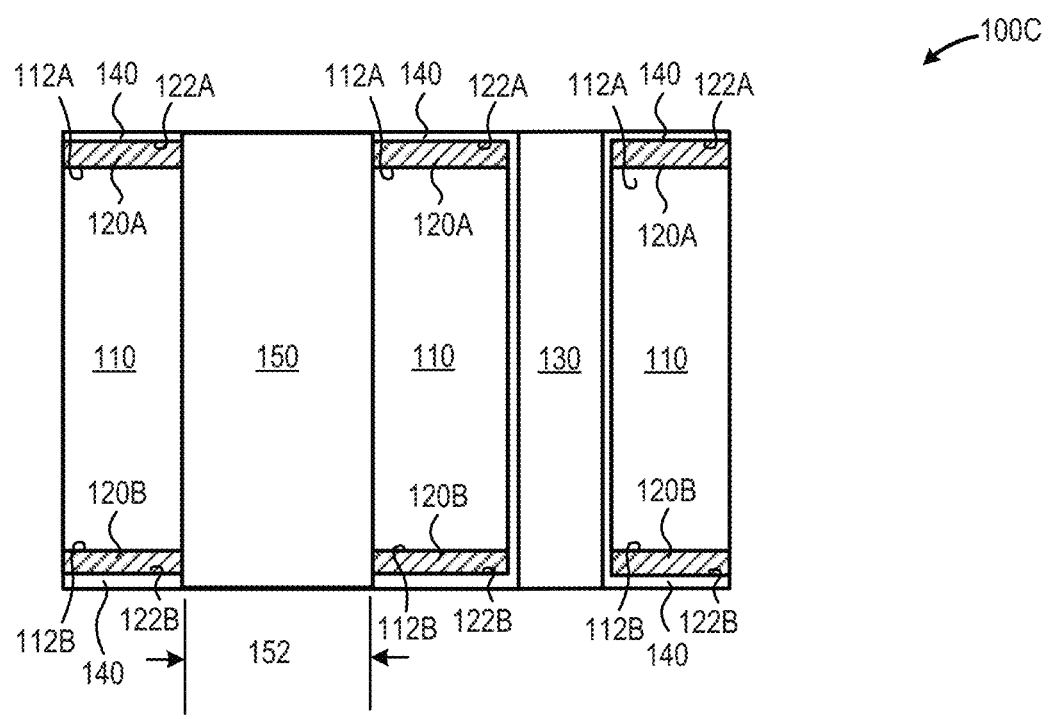
FIG. 1C depicts an illustrative semiconductor package substrate after forming a second through-hole having a generally uniform, relatively large, second diameter, in accordance with at least one embodiment described herein.

FIG. 1C depicts an illustrative semiconductor package substrate 100C after forming a second through-hole 150 having a generally uniform, relatively large, second diameter 152, in accordance with at least one embodiment described herein. The second through-hole 150 may be formed through the seed layer 140, the conductive layers 120 and the substrate core 110 using any number and/or combination of currently available and/or future developed material removal processes or methods. In embodiments, the second through-hole 150 may be formed mechanically, for example by drilling or mechanical abrasion. In embodiments, the second through-hole 150 may be formed by ablation, for example via laser ablation. In embodiments, the second through-hole 150 may be formed via etching. The second through-hole 150 may have a generally uniform, relatively large, second diameter 152. In embodiments, the second through-hole 150 may have a second diameter 152 of: about 20 micrometers (μm) or less; about 40 μm or less; about 60 μm or less; about 80 μm or less; or about 100 μm or less.

FIG. 1C depicts an illustrative semiconductor package substrate 100C after forming a second through-hole 150 having a generally uniform, relatively large, second diameter 152, in accordance with at least one embodiment described herein. The second through-hole 150 may be formed through the seed layer 140, the conductive layers 120 and the substrate core 110 using any number and/or combination of currently available and/or future developed material removal processes or methods. In embodiments, the second through-hole 150 may be formed mechanically, for example by drilling or mechanical abrasion. In embodiments, the second through-hole 150 may be formed by ablation, for example via laser ablation. In embodiments, the second through-hole 150 may be formed via etching. The second through-hole 150 may have a generally uniform, relatively large, second diameter 152. In embodiments, the second through-hole 150 may have a second diameter 152 of: about 20 micrometers (μm) or less; about 40 μm or less; about 60 μm or less; about 80 μm or less; or about 100 μm or less.

Figure 1D:
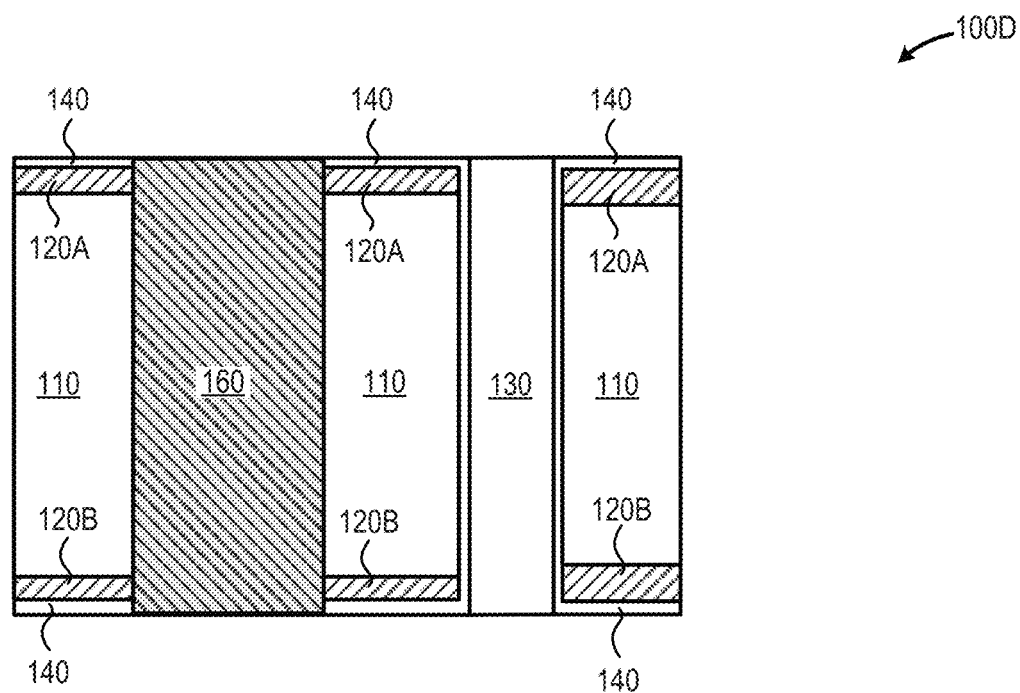
FIG. 1D depicts an illustrative semiconductor package substrate after filling the second through-hole with a curable magnetic material, in accordance with at least one embodiment described herein.

FIG. 1D depicts an illustrative semiconductor package substrate 100D after filling the second through-hole 150 with a curable magnetic material 160, in accordance with at least one embodiment described herein. In embodiments, the curable magnetic material 160 may include one or more magnetic particles, nanoparticles, and/or nanostructures disposed in an electrically nonconductive or electrically insulative carrier. In embodiments, the magnetic particles in the curable magnetic material 160 may be arranged substantially isotropically to form a relatively uniform magnetic field. In such embodiments, the curable magnetic material 160 may be disposed in the second through-hole 150 while the semiconductor package substrate 100D is placed in an externally applied magnetic field having a desired polarity. In embodiments, the magnetic particles in the curable magnetic material 160 may be arranged anisotropically.

The curable magnetic material 160 may be at least partially disposed in the second through-hole 150 using any number and/or combination of currently available and/or future developed systems and/or devices capable of positioning the curable magnetic material 160 in the second through-hole. In embodiments, the curable magnetic material 160 may be selectively deposited in the second through-hole 150 using a hollow member fluidly coupled to a reservoir containing the flowable curable magnetic material 160. In embodiments, the hollow member may be inserted into the second through-hole 150 and the curable magnetic material forced through the hollow member and into the second through-hole 150. In embodiments, the curable magnetic material 160 may be disposed in the second through-hole 150 using one or more of the following: roller coating; screen printing; vacuum plugging; or combinations thereof. In embodiments, the carrier matrix used to transport the magnetic particles may include one or more of: a thermosetting carrier matrix or a UV-curable carrier matrix. In embodiments, the curable magnetic material 160 may have a solids concentration of: about 50% by weight (wt %) or greater; about 60 wt % or greater; about 70 wt % or greater; about 80 wt % or greater; about 90 wt % or greater; or about 95 wt % or greater.

In embodiments, after disposing the curable magnetic material 160 in the second through-hole 150, one or more surface finishing processes or systems may be applied to the upper surface and/or the lower surface of the semiconductor package substrate 100D. Such surface finishing processes may be performed using any currently available or future developed surface finishing process or system. For example, the upper surface and the lower surface of the semiconductor package substrate 100D may be mechanically finished through grounding and/or polishing such that the upper surface of the curable magnetic material 160 remains substantially co-planar with the upper surface of the semiconductor package substrate 100D and/or the lower surface of the curable magnetic material 160 remains substantially co-planar with the lower surface of the semiconductor package substrate 100D.

In embodiments, a thermosetting curable magnetic material 160 may be cured by subjecting the semiconductor package substrate 100D to an elevated temperature for a defined period sufficient to at least partially cure the curable magnetic material 160. For example, a thermosetting curable magnetic material 160 may be at least partially cured by exposing the semiconductor package substrate 100D to a temperature of: about 120° C. or greater; about 140° C. or greater; about 160° C. or greater; about 180° C. or greater; or about 200° C. or greater. In embodiments, a UV curable magnetic material 160 may be cured by exposing the semiconductor package substrate 100D to electromagnetic radiation at a given frequency and/or frequency band in the ultraviolet spectrum (e.g., wavelengths less than 390 nanometers) for a period sufficient to at least partially cure the curable magnetic material 160.

Figure 1E:
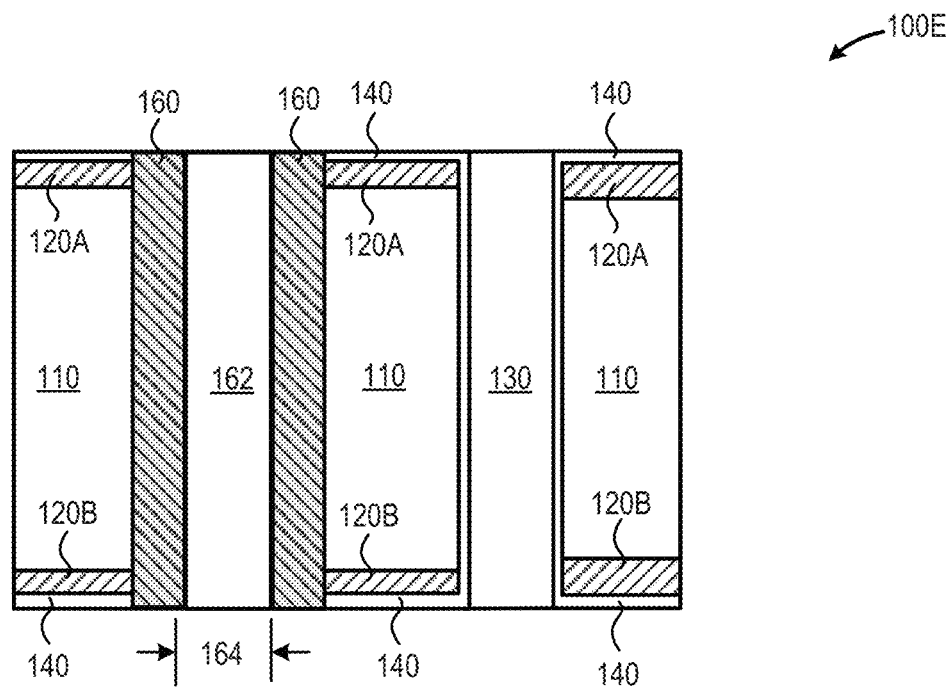
FIG. 1E depicts an illustrative semiconductor package substrate after forming a third through-hole having a generally uniform, relatively small, third diameter through-hole through the curable magnetic material, in accordance with at least one embodiment described herein.

FIG. 1E depicts an illustrative semiconductor package substrate 100E after forming a third through-hole 162 having a generally uniform, relatively small, third diameter 164 through-hole through the curable magnetic material 160, in accordance with at least one embodiment described herein. In embodiments, the third diameter 164 may the similar to or the same as the first diameter 132 of the first through-hole 130. In other embodiments, the third diameter 164 may be different from the first diameter 132 of the first through-hole 130. The third through-hole 162 may be formed through the curable magnetic material 160 using any number and/or combination of currently available and/or future developed material removal processes or methods. In embodiments, the third through-hole 162 may be formed mechanically, for example by drilling or mechanical abrasion. In embodiments, the third through-hole 162 may be formed by ablation, for example via laser ablation. In embodiments, the third through-hole 162 may be formed via etching. In embodiments, the third through-hole 164 may have a third diameter 164 of: about 10 micrometers (μm) or less; about 25 μm or less; about 40 μm or less; about 50 μm or less; or about 60 μm or less.

Figure 1F:
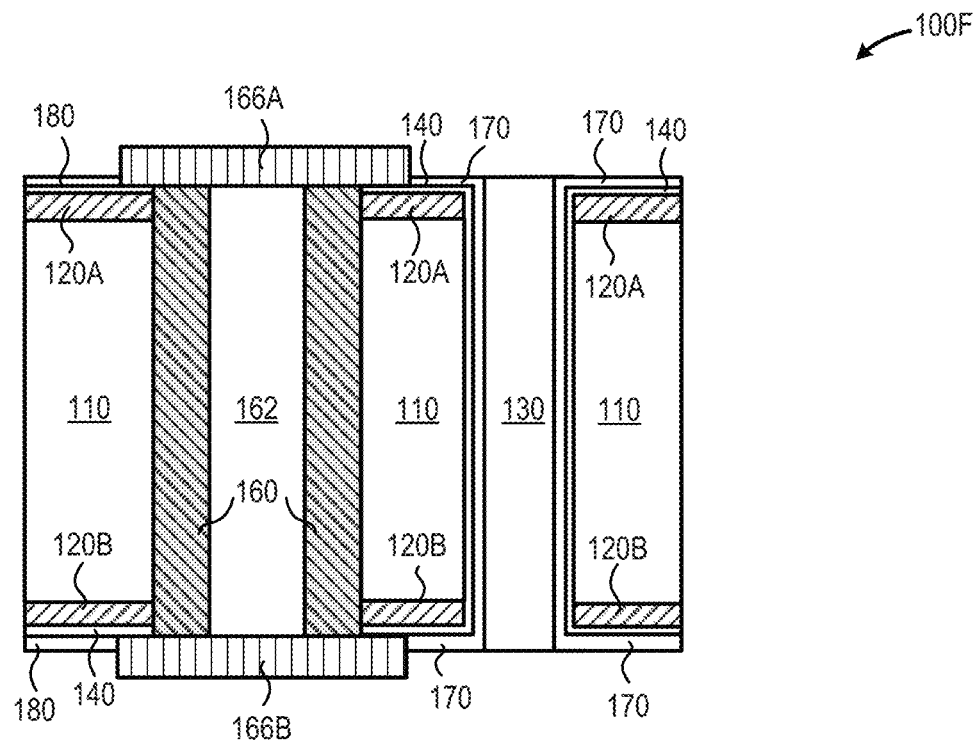
FIG. 1F depicts an illustrative semiconductor package substrate in which sealants and are disposed proximate the curable magnetic material such that no exposed curable magnetic material remains, in accordance with at least one embodiment described herein.

FIG. 1F depicts an illustrative semiconductor package substrate 100F in which sealants 166A and 166B (collectively, "sealants 166") are disposed proximate the curable magnetic material 160 such that no exposed curable magnetic material 160 remains, in accordance with at least one embodiment described herein. As depicted in FIG. 1F, a conductive layer 170 deposited after sealing the curable magnetic material builds on the surface of the semiconductor package substrate 100F and on the interior surfaces of the first through-hole 130. Beneficially, the presence of the sealants 166 prevents the curable magnetic material from contaminating the wet chemistry processes, such as desmear, used to prepare the semiconductor package substrate 100F for deposition of the conductive layer 170 and the wet chemistry processes, such as electro-less deposition, used to deposit the conductive layer 170 on the semiconductor package substrate 100F.

The sealants 166 may include any material and/or combination of materials that are resistant to chemical attack by the wet chemistry processes used to prepare the semiconductor package substrate 100F for plating and by the wet chemistry processes used to deposit the conductive layer 170 on the semiconductor package substrate 100F. In sealants 166 may be deposited proximate the curable magnetic material 160 using any combination and/or number of currently available and/or future developed material deposition systems or processes. In embodiments, the sealants 166 may be patterned on at least a portion of the surface of the semiconductor package substrate 100F. An example material deposition process includes, but is not limited to photolithography. In embodiments, the sealants may include a dry film resist material patterned on the surface of the semiconductor package substrate 100F.

The conductive layer 170 may include any electrically conductive material and/or combination of electrically conductive materials. The conductive layer 170 may include one or more electrically conductive metals, one or more electrically conductive non-metallic materials, and/or one or more electrically conductive composite materials. Example electrically conductive metals include but are not limited to: copper and copper-containing alloys; aluminum and aluminum-containing alloys; gold and gold-containing alloys; and silver and silver-containing alloys. Conductive polymers are an example electrically conductive non-metallic material. A polymeric matrix that carries electrically conductive particles, nanowires, or similar nanoparticles provides an example electrically conductive composite material.

The conductive layer 170 may be patterned, formed, or otherwise deposited on, about, or across at least a portion of the surface of the semiconductor package substrate 100F and on, about, or across at least a portion of the interior surfaces of the first through-hole 130 using any number and/or combination of currently available and/or future developed material deposition systems or methods. In embodiments, the conductive layer 170 may be deposited via one or more wet chemistry processes, for example, via electro-less plating. The conductive layer 170 may have a uniform or non-uniform thickness. In embodiments, the conductive layer 170 may have a thickness of: about 10 micrometers (μm) or less: about 20 μm or less; about 40 μm or less; about 60 μm or less; about 80 μm or less; about 100 μm or less; about 150 μm or less; or about 200 μm or less.

Figure 1G:
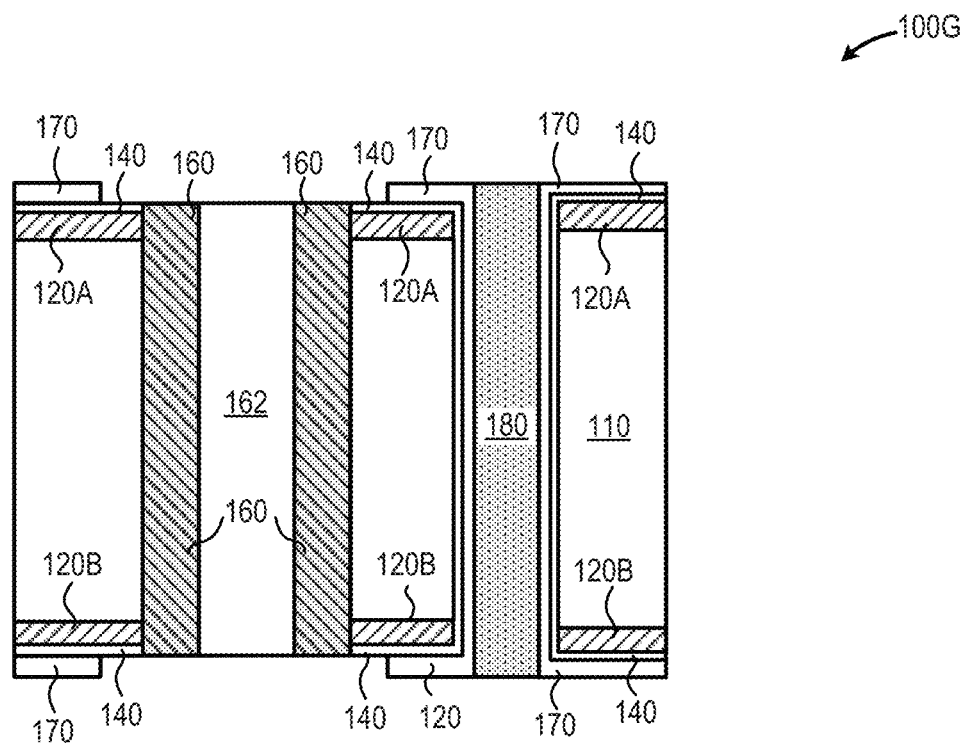
FIG. 1G depicts an illustrative semiconductor package substrate in which the sealants have been selectively stripped to expose the curable magnetic material and in which a filler material at least partially fills the first through hole, in accordance with at least one embodiment described herein.

FIG. 1G depicts an illustrative semiconductor package substrate 100G in which the sealants 166 have been selectively stripped to expose the curable magnetic material 160 and in which a filler material 180 at least partially fills the first through hole 130, in accordance with at least one embodiment described herein. As depicted in FIG. 1G, the sealants 166 may be selectively stripped using any currently available or future developed material removal system or method. In at least one embodiment, the sealants 166 may be selectively stripped and the curable magnetic material 160 exposed using a solution containing one or more compounds such as sodium hydroxide, amines, or combinations thereof.

The filler material 180 may be disposed in and at least partially fill the first through-hole 130. The filler material 180 may include one or more dielectric materials, one or more conductive materials, one or more insulators, or combinations thereof. The filler material 180 may be at least partially disposed in the first through-hole 130 using any number and/or combination of currently available and/or future developed systems and/or devices capable of positioning the filler material 180 in the first through-hole. In embodiments, the filler material 180 may be selectively deposited in the first through-hole 130 using a hollow member fluidly coupled to a reservoir containing a flowable filler material 180. In embodiments, the hollow member may be inserted into the first through-hole 130 and the filler material 180 forced through the hollow member and into the first through-hole 130. In embodiments, the filler material 180 may be disposed in the first through-hole 130 using one or more of the following: roller coating; screen printing; vacuum plugging; or combinations thereof. The filler material 180 may include one or more conductive pastes that contain one or more conductive materials suspended in or carried by a carrier matrix. The filler material 180 may include one or more conductive pastes that includes one or more electrically non-conductive materials, one or more ceramics, one or more polymers at a concentration sufficient to provide a desired coefficient of thermal expansion and/or similar mechanical properties.

The filler material 180 may be mechanically and/or chemically finished flush with all or as portion of the surrounding portion of the surface of the semiconductor package substrate 100G. In one or more embodiments, the carrier matrix used to transport the filler material may include one or more of: a thermosetting carrier matrix or a UV-curable carrier matrix. In one or more embodiments, the filler material 180 may have a solids concentration of: about 50% by weight (wt %) or greater; about 60 wt % or greater; about 70 wt % or greater; about 80 wt % or greater; about 90 wt % or greater; or about 95 wt % or greater.

Figure 1H:
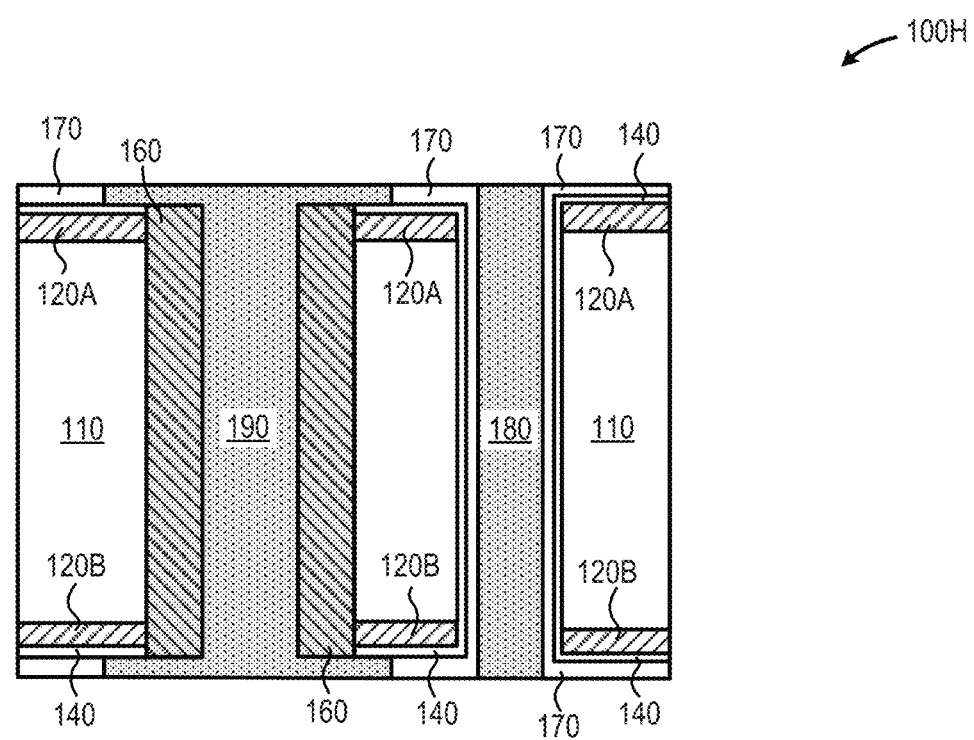
FIG. 1H depicts an illustrative semiconductor package substrate in which a conductive filler material at least partially fills the third through hole, in accordance with at least one embodiment described herein.

FIG. 1H depicts an illustrative semiconductor package substrate 100H in which a conductive filler material 190 at least partially fills the third through hole 162, in accordance with at least one embodiment described herein. The conductive filler material 190 may be disposed in and at least partially fill the third through-hole 162. The conductive filler material 190 may include one or more electrically conductive materials, such as one or more metals or metal containing compounds dispersed in a carrier matrix. The conductive filler material 190 may be at least partially disposed in the third through-hole 162 using any number and/or combination of currently available and/or future developed systems and/or devices capable of positioning the conductive filler material 190 in the third through-hole 162. In embodiments, the conductive filler material 190 may be selectively deposited in the third through-hole 162 using a hollow member fluidly coupled to a reservoir containing a flowable conductive filler material 190. In embodiments, the hollow member may be inserted into the third through-hole 162 and the conductive filler material 190 forced through the hollow member and into the third through-hole 162. In embodiments, the conductive filler material 190 may be disposed in the third through-hole 162 using one or more of the following: roller coating; screen printing; vacuum plugging; or combinations thereof. In embodiments, the carrier matrix used to transport the conductive filler material may include one or more of: a thermosetting carrier matrix or a UV-curable carrier matrix.

The conductive filler material 190 may be mechanically and/or chemically finished flush with all or a portion of the surrounding portion of the surface of the semiconductor package substrate 100H. In embodiments, the conductive filler material 190 may have a solids concentration of: about 50% by weight (wt %) or greater; about 60 wt % or greater; about 70 wt % or greater; about 80 wt % or greater; about 90 wt % or greater; or about 95 wt % or greater.

In embodiments, after disposing the conductive filler material 190 in the third through-hole 162, one or more surface finishing processes or systems may be applied to the upper surface and/or the lower surface of the semiconductor package substrate 100H. Such surface finishing processes may be performed using any currently available or future developed surface finishing process or system. For example, the upper surface and the lower surface of the semiconductor package substrate 100H may be mechanically finished through grounding and/or polishing such that the upper surface of the conductive filler material 190 and/or the upper surface of the filler material 180 remains substantially co-planar with the upper surface of the semiconductor package substrate 100H and/or the lower surface of the conductive filler material 190 and/or the filler material 180 remains substantially co-planar with the lower surface of the semiconductor package substrate 100H.

In embodiments, a thermosetting conductive filler material 190 may be cured by subjecting the semiconductor package substrate 100H to an elevated temperature for a defined period sufficient to completely cure the conductive filler material 190. For example, a thermosetting conductive filler material 190 may be cured by subjecting the semiconductor package substrate 100H to a temperature of: about 120° C. or greater; about 140° C. or greater; about 160° C. or greater; about 180° C. or greater; or about 200° C. or greater. In embodiments, a UV curable conductive filler material 190 may be cured by exposing the semiconductor package substrate 100H to electromagnetic radiation at a given frequency and/or frequency band in the ultraviolet spectrum (e.g., wavelengths less than 390 nanometers) for a defined period sufficient to at least partially cure the conductive filler material 190.

Figure 1I:
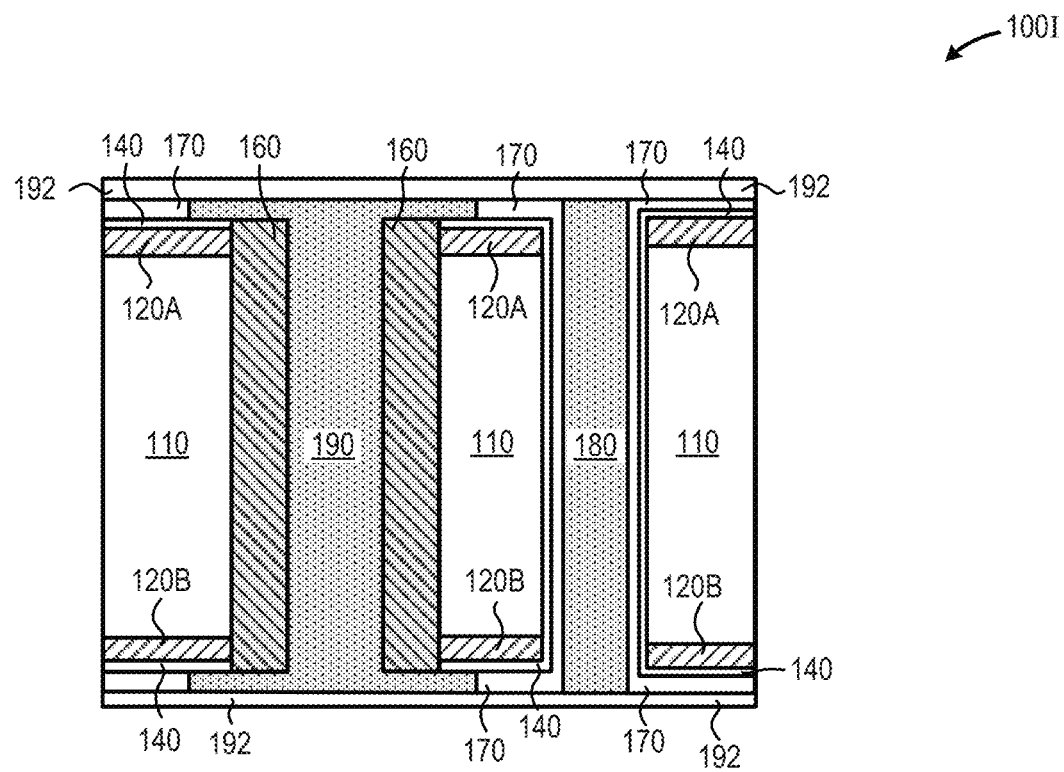
FIG. 1I depicts an illustrative semiconductor package substrate in which a conductive lid layer has been disposed across at least a portion of the upper surface of the semiconductor package substrate and/or across at least a portion of the lower surface of the semiconductor package substrate, in accordance with at least one embodiment described herein.

FIG. 1I depicts an illustrative semiconductor package substrate 100I in which a conductive lid layer 192 has been disposed across at least a portion of the upper surface of the semiconductor package substrate 100I and/or across at least a portion of the lower surface of the semiconductor package substrate 100I, in accordance with at least one embodiment described herein. In embodiments, a surface preparation treatment or etchback, often referred to as a "desmear," may be applied to the semiconductor package substrate 100I to prepare the surface of the semiconductor package substrate 100I for the application of the conductive lid layer 192. The surface preparation treatment roughens and cleans the surface of conductive layer 170, the upper and lower surfaces of the fill material 180, and the upper and lower surfaces of the conductive fill material 190. The surface preparation treatment may include one or more "wet chemistry" processes where the semiconductor package substrate 100I is exposed to a spray of, or immersed in a bath containing, one or more chemical compounds, for example one or more permanganate compounds, one or more caustic compounds, or combinations thereof. In some implementations, the surface preparation treatment may include one or more chemical solution baths maintained at an elevated temperature.

In embodiments, the conductive lid layer 192 may be deposited across all or a portion of the conductive layer 170, the upper and lower surfaces of the fill material 180, and the upper and lower surfaces of the conductive fill material 190 using any number and/or combination of currently available or future developed material deposition processes or systems. In some implementations, the conductive lid layer 192 may be deposited via one or more electro-less, auto-catalytic, or chemical plating processes in which the semiconductor package substrate 100I is immersed in bath containing metal ions. The conductive lid layer 192 may have a substantially uniform thickness across all or a portion of the conductive layers 120. The seed layer 140 may have a substantially uniform thickness across all or a portion of the the conductive layer 170, the upper and lower surfaces of the fill material 180, and the upper and lower surfaces of the conductive fill material 190. In embodiments, the conductive lid layer 192 may have a thickness of: about 5 micrometers (μm) or less; about 10 μm or less; about 20 μm or less; about 50 μm or less; about 75 μm or less; or about 100 μm or less.

Figure 1J:
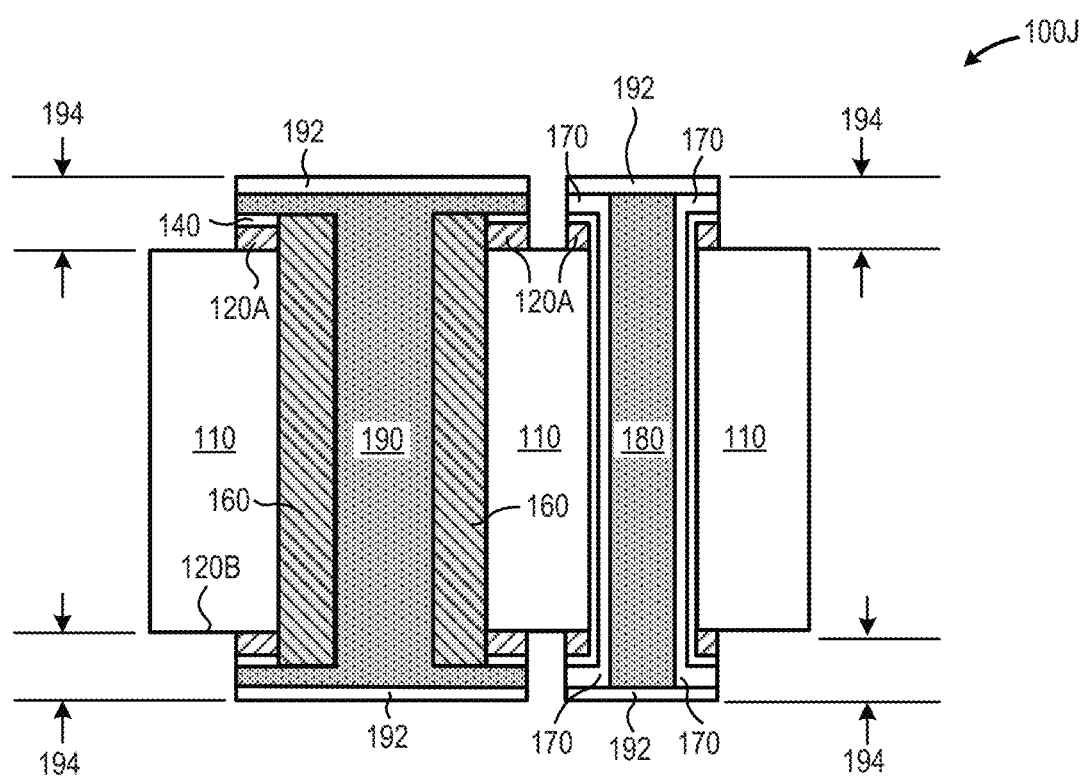
FIG. 1J depicts an illustrative semiconductor package substrate in which at least a portion of the conductive layers on the upper surface and the lower surface of the semiconductor package substrate have been selectively removed to provide conductive pads coupled to the upper and lower surfaces of the filled first through-hole and conductive pads coupled to the upper and lower surfaces of the filled, magnetic material lined, second through-hole, in accordance with at least one embodiment described herein.

FIG. 1J depicts an illustrative semiconductor package substrate 100J in which at least a portion of the conductive layers 120, 140, 170, and 192 on the upper surface 112A and the lower surface 112B of the semiconductor package substrate 100I have been selectively removed to provide conductive pads coupled to the upper and lower surfaces of the filled first through-hole 130 and conductive pads coupled to the upper and lower surfaces of the filled, magnetic material lined, second through-hole 130, in accordance with at least one embodiment described herein. Beneficially, the conductive pads coupled to the first through-hole and the conductive pads coupled to the second through-hole have the same projection 194 from the upper surface 112A of the semiconductor package core 110 and from the lower surface 112B of the semiconductor package core 110. The conductive layers may be selectively removed using any number and/or combination of currently available and/or future developed material removal systems or methods. In at least some embodiments, the conductive layers may be photolithographically removed.

Figure 2:
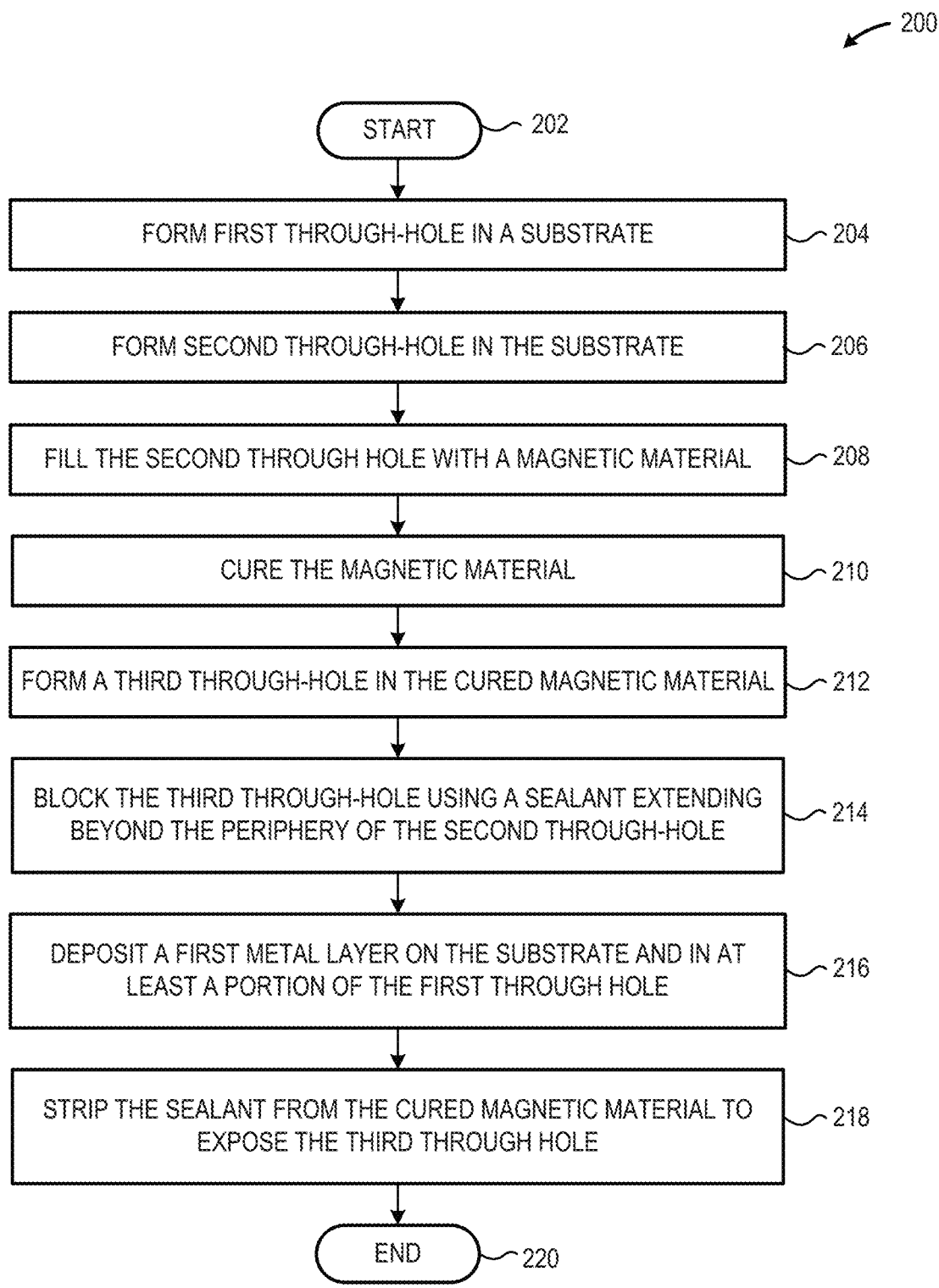
FIG. 2 is a high-level flow diagram of an illustrative method of forming a magnetic lined semiconductor package substrate through-hole, in accordance with at least one embodiment described herein.

FIG. 2 is a high-level flow diagram of an illustrative method 200 of forming a magnetic lined semiconductor package substrate through-hole, in accordance with at least one embodiment described herein. In embodiments, a magnetic core inductor may be formed in a semiconductor package substrate by depositing a magnetic material in a relatively large-diameter through-hole, curing the magnetic material, and forming a relatively small diameter through-hole in the cured magnetic material. The magnetic material is then sealed using a sealant prior to performing wet chemistry processing on the semiconductor package substrate. After completing the wet chemistry semiconductor package processing steps, the sealant may be removed and the semiconductor package processing may be completed. The method 200 commences at 202.

At 204, a first through-hole 130 may be formed in a semiconductor package core 100. In embodiments, the first through-hole 130 may extend from an upper surface 112A of the semiconductor package core 110 to a lower surface of the semiconductor package core 110. The first through-hole 130 may have a relatively small diameter 132. The first through-hole 130 may have a substantially uniform diameter through the semiconductor package core 110. In at least some embodiments, after forming the first through-hole 130, one or more surface treatments (e.g., a desmear process) may be performed to prepare the surface of the semiconductor package core 110 and the interior surfaces of the first through-hole 130 for the deposition of a conductive layer 120 that serves as a seed layer for future electro-less deposition of conductive layers on the semiconductor package substrate 100. In embodiments, the conductive layer 120 may be deposited on, about, or across at least a portion of the upper surface 112A and the lower surface 112B of the semiconductor package core 110. In embodiments, the conductive layer 120 may be deposited on, about, or across at least a portion of the interior surfaces of the first through-hole 130 formed in the semiconductor package core 110.

At 206, a second through-hole 150 may be formed through the semiconductor package core 110 and the seed layers 120A and 120B. In embodiments, the second through-hole 150 may have a relatively large second diameter 152 when compared to the diameter 132 of the first through hole 130. The second through-hole 150 may be formed in the semiconductor package substrate 100 using any currently available or future developed mechanical, chemical, or electromagnetic material removal system or method, such as by drilling or laser ablation.

At 208, a curable magnetic material 160 at least partially fills the second through-hole 150. In some implementations, the upper surface of the curable magnetic material 160 may be flush or co-planar with the upper surface of the seed layer 140. In some implementations the curable magnetic material 160 may be flush or co-planar with the lower surface of the seed layer 140. In embodiments, the curable magnetic material 160 may include magnetic particles in a flowable, curable, carrier matrix. The magnetic particles within the curable magnetic material 160 may be dispersed isotropically or anisotropiocally within the second through-hole 150. The curable magnetic material 160 may be disposed in the second through-hole 150 using any currently available or future developed material deposition system or method.

At 210, the curable magnetic material 160 is cured. In embodiments, the curable magnetic material carrier matrix may include one or more thermosetting materials. In such embodiments, the curable magnetic material 160 may be cured by exposing the semiconductor package substrate 100 to an elevated temperature for a period sufficient to at least partially cure the carrier matrix. In other embodiments, the curable magnetic material carrier matrix may include one or more that set upon exposure to a defined electromagnetic spectrum (e.g., ultraviolet or UV curable). In such embodiments, the curable magnetic material 160 may be cured by exposing the semiconductor package substrate 100 to a portion of the electromagnetic spectrum for a period sufficient to at least partially cure the carrier matrix.

At 212, a third through-hole 162 may be formed through the cured magnetic material 160. In embodiments, the third through-hole may have a diameter 164 similar to or the same as the diameter 132 of the first through-hole 130. In embodiments, the third through-hole 162 may have a relatively small diameter 164 when compared to the diameter 152 of the second through hole 150. The third through-hole 162 may be formed in the cured magnetic material 160 using any currently available or future developed mechanical, chemical, or electromagnetic material removal system or method, such as by drilling or laser ablation.

At 214, sealants 166A, 166B are disposed proximate each end of the third through-hole 164. The sealants 166A, 166B extend beyond the perimeter of the second through-hole 150 such that no magnetic material 160 remains exposed after deposition of the sealants 166A, 166B. The sealants may be disposed using any currently available or future developed material deposition process. In embodiments, the sealants may include a dry-film resist material that is photolithographically patterned onto the surface of the semiconductor package substrate 100.

At 216, a conductive layer 170 is patterned, deposited, formed, or otherwise disposed on, about, or across at least a portion of the semiconductor package substrate 100. In embodiments, a one or more wet-chemistry surface preparation processes (e.g., "desmear") may be performed on the semiconductor package substrate 100 preparatory to depositing the conductive layer 170. In addition, the conductive layer 170 may be deposited using one or more wet-chemistry processes (e.g., electro-less plating). The presence of the sealants 166 on the cured magnetic material 160 beneficially prevents contamination of the wet-chemistry processes by the magnetic material 160 disposed in the second through-hole 150. The conductive layer may be deposited using any currently available or future developed material deposition system or method.

At 218, the sealants 166 are stripped from the surface of the semiconductor package substrate 100. The sealants 166 may be stripped using any currently available or future developed material removal system or method. The method 200 concludes at 220.

Figure 3:
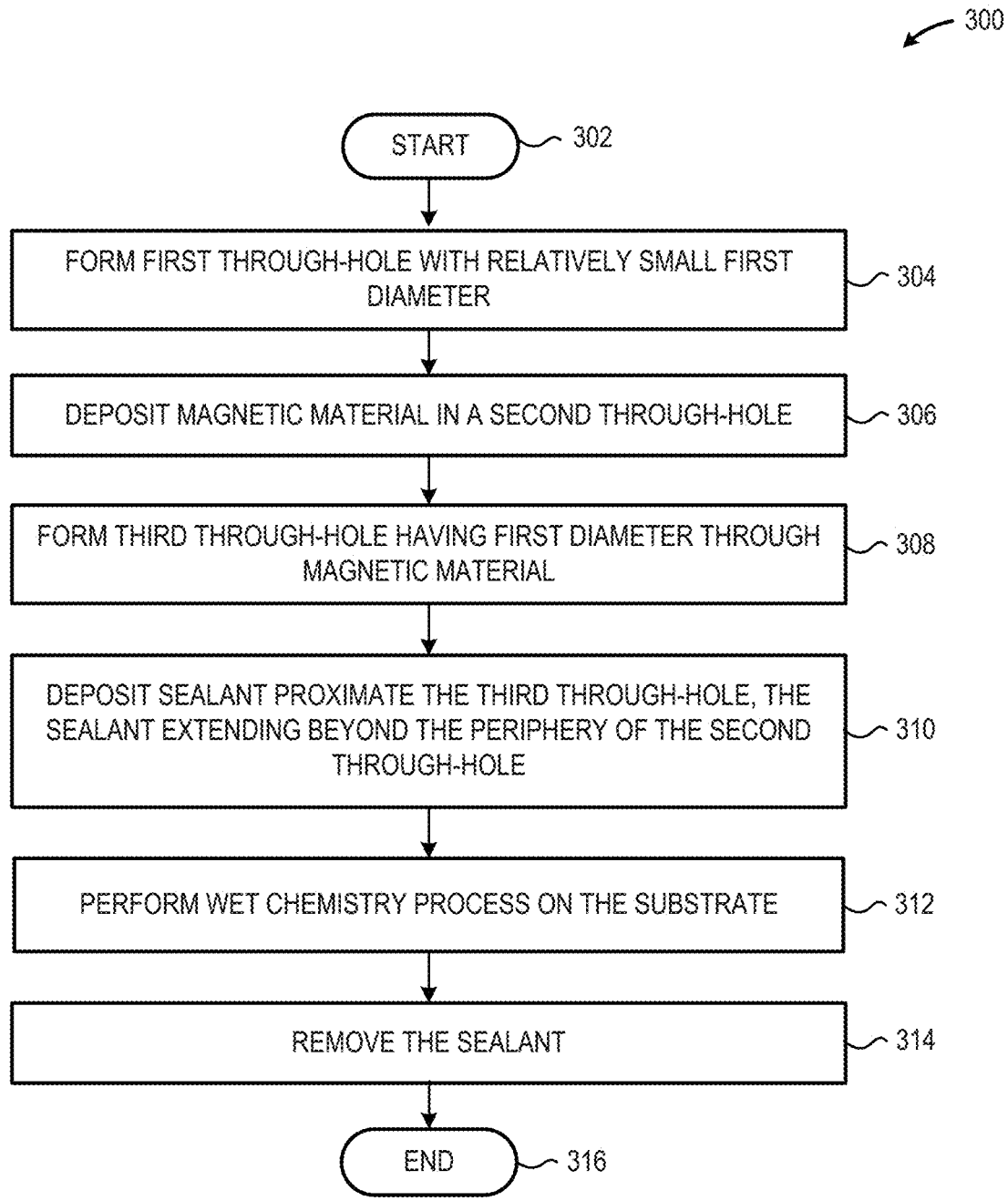
FIG. 3 is a high-level flow diagram of an illustrative method of forming a magnetic lined semiconductor package substrate through-hole, in accordance with at least one embodiment described herein.

FIG. 3 is a high-level flow diagram of an illustrative method 300 of forming a magnetic lined semiconductor package substrate through-hole, in accordance with at least one embodiment described herein. In embodiments, a magnetic core inductor may be formed in a semiconductor package substrate by depositing a magnetic material in a relatively large-diameter through-hole, curing the magnetic material, and forming a relatively small diameter through-hole in the cured magnetic material. The magnetic material is then sealed using a sealant prior to performing wet chemistry processing on the semiconductor package substrate. After completing the wet chemistry semiconductor package processing steps, the sealant may be removed and the semiconductor package processing may be completed. The method 300 commences at 302.

At 304, a first through-hole 130 is formed in the semiconductor package substrate 100. The first through-hole 130 may have a relatively small, first diameter 132. The first through-hole 130 may be formed using any currently available or future developed material removal system or method.

At 306, a second through-hole 150 is formed in the semiconductor package substrate 100. The second through-hole 150 may have a relatively large, second diameter 152. The second through-hole 150 may be formed using any currently available or future developed material removal system or method. The second through-hole 150 is filled with a curable magnetic material 160.

At 308, a third through-hole 162 is formed through the curable magnetic material 160. The diameter 164 of the third through-hole 162 may the same as or similar to the diameter 132 of the first through-hole 130.

At 310, a sealant 166 is disposed proximate each end of the third through-hole 164. The sealant 166 extends beyond the perimeter of the second through-hole 150 such that the magnetic material disposed in the second through-hole 150 is completely covered and not exposed to the external environment. In one or more embodiments, the sealant 166 may include a dry film resist material that is photolithographically patterned on the surfaces of the semiconductor package substrate 100.

At 312, one or more wet chemistry processes are performed on the semiconductor package substrate 100. Example wet chemistry processes include but are not limited to: surface preparation processes, such as desmear, and deposition processes, such as electro-less deposition.

At 314, after completion of the one or more wet chemistry processes, the sealant 166 is removed from the surface of the semiconductor package substrate 100. The method 300 concludes at 316.

While FIGS. 2 and 3 illustrate various operations according to one or more embodiments, it is to be understood that not all of the operations depicted in FIGS. 2 and 3 are necessary for other embodiments. Indeed, it is fully contemplated herein that in other embodiments of the present disclosure, the operations depicted in FIGS. 2 and 3, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods described herein provide for the fabrication of semiconductor package substrates having magnetic inductors formed in at least a portion of the through-holes formed in the semiconductor package substrate. Such magnetic inductors are formed without exposing the magnetic material disposed in the through-hole to any wet chemistry (desmear, electro-less plating etc.) processes by sealing the magnetic material with a patterned sealant (e.g., patterned dry film resist) which seals the magnetic material prior to performing steps involving wet chemistry on the semiconductor package substrate. The patterned sealant is removed subsequent to the semiconductor package processing steps involving wet chemistry. The systems and methods described herein beneficially result in the formation of conventional through-holes and magnetically lined through holes having the same pad height on the surface of the semiconductor package substrate. The systems and methods described herein beneficially reduce or even eliminate contamination of the wet chemistry reagents by the magnetic material used to line selected through-holes in the semiconductor package substrate. The systems and methods described herein provide for magnetic material lined through holes having a conductive core formed using one or more conductive pastes.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for forming magnetically lined through-holes in a semiconductor package substrate.

According to example 1, there is provided a method of forming a through-hole lined with a magnetic material. The method may include: forming a first through-hole in a substrate having an upper surface and a lower surface; forming a second through-hole in the substrate; filling the second through hole with a magnetic material such that an upper surface of the magnetic material is flush with the upper surface of the substrate and a lower surface of the magnetic material is flush with the lower surface of the substrate; forming a third through-hole in the magnetic material, the third through-hole extending from the upper surface of the magnetic material to the lower surface of the magnetic material; sealing the third through-hole on the upper surface and the lower surface of the magnetic material using a sealant that extends beyond the periphery of the second through-hole, the sealant disposed on at least a portion of an upper surface and the lower surface of the magnetic material; depositing a first metal layer on at least a portion of the substrate and in at least a portion of the first through-hole; stripping the sealant from the upper surface and the lower surface of the magnetic material to expose the magnetic material and the third through-hole; at least partially filling the third through-hole with a conductive paste that includes one or more electrically conductive materials; grinding the conductive paste; and curing the conductive paste at a temperature less than a glass transition temperature of the substrate.

Example 2 may include elements of example 1 where filling the third through-hole with a conductive paste that includes one or more electrically conductive materials may include: at least partially filling the third through-hole with a conductive paste that includes the one or more electrically conductive materials and or more non-electrically conductive materials.

Example 3 may include elements of any of examples 1 or 2 where at least partially filling the third through-hole with a conductive paste that includes one or more electrically conductive materials may further include: at least partially filling the third through-hole with a conductive paste that includes one or more electrically conductive materials using a wet process deposition.

Example 4 may include elements of any of examples 1 through 3 and the method may additionally include depositing a second metal layer proximate the conductive paste and proximate at least a portion of the first metal layer.

Example 5 may include elements of any of examples 1 through 4 and the method may additionally include etching at least a portion of the first metal layer and the second metal layer to expose at least a portion of the substrate.

Example 6 may include elements of any of examples 1 through 5 where forming a third through hole in the magnetic material may include: forming a third through hole in the magnetic material wherein the first through-hole comprises a through-hole having a first diameter and the third through hole comprises a through-hole having the first diameter.

Example 7 may include elements of any of examples 1 through 6 where sealing the through-hole on the upper surface and the lower surface of the magnetic material using a sealant may include: patterning a thin film resist material proximate the upper surface of the magnetic material and proximate the lower surface of the magnetic material.

According to example 8, there is provided a method of forming a through-hole lined with a magnetic material. The method may include: forming a first through-hole having a relatively small first diameter through a substrate having an upper surface and a lower surface; depositing a magnetic material in a second through-hole having a relatively large second diameter that extends from the upper surface of the substrate to the lower surface of the substrate; forming a third through-hole through the magnetic material, the third through-hole having the relatively small first diameter; depositing a sealant proximate the third through-hole, the sealant extending beyond the periphery of the second through-hole, the sealant proximate the upper surface of the substrate and proximate the lower surface of the substrate; performing one or more wet chemistry processes on the substrate; removing the sealant; and at least partially filling the third through-hole with a conductive paste that includes one or more electrically conductive materials.

Example 9 may include elements of example 8 where performing one or more wet chemistry processes on the substrate may include: performing at least one of: a desmear wet chemistry process or a metal deposition wet chemistry process.

Example 10 may include elements of any of examples 8 or 9 where performing a metal deposition wet chemistry process may include: performing an electroless plating wet chemistry process.

Example 11 may include elements of any of examples 8 through 10 where depositing a sealant proximate the third through-hole may include: patterning a dry film resist layer proximate the third through-hole and extending beyond the periphery of the second through-hole.

Example 12 may include elements of any of examples 8 through 11 where at least partially filling the third through-hole with a conductive paste that includes one or more electrically conductive materials may further include: at least partially filling the third through-hole with a conductive paste that includes the one or more electrically conductive materials and one or more electrically non-conductive materials.

Example 13 may include elements of any of examples 8 through 12 and the method may additionally include: depositing a filler material in the first through-hole.

Example 14 may include elements of any of examples 8 through 13 and the method may further include depositing a metal layer across the conductive paste in the third through hole and the filler material in the first through-hole.

Example 15 may include elements of any of examples 8 through 14 and the method may further include: etching at least a portion of the metal layer to expose at least a portion of the substrate such that a first conductive pad coupled to the filler material in the first through-hole and a second conductive pad coupled to the conductive paste in the third through-hole both extend a distance from at least the upper surface of the substrate.

According to example 16, there is provided a system for forming a through-hole lined with a magnetic material. The system may include: means for forming a first through-hole having a relatively small first diameter through a substrate having an upper surface and a lower surface; means for depositing a magnetic material in a second through-hole having a relatively large second diameter that extends from the upper surface of the substrate to the lower surface of the substrate; means for forming a third through-hole through the magnetic material, the third through-hole having the relatively small first diameter; means for depositing a sealant proximate the third through-hole, the sealant extending beyond the periphery of the second through-hole, the sealant proximate the upper surface of the substrate and proximate the lower surface of the substrate; means for performing one or more wet chemistry processes on the substrate; means for removing the sealant; and means for at least partially filling the third through-hole with a conductive paste that includes one or more electrically conductive materials.

Example 17 may include elements of example 16 where the means for performing one or more wet chemistry processes on the substrate may include: means for performing at least one of: a desmear wet chemistry process or a metal deposition wet chemistry process.

Example 18 may include elements of any of examples 16 or 17 where the means for performing a metal deposition wet chemistry process may include: means for performing an electroless plating wet chemistry process.

Example 19 may include elements of any of examples 16 through 18 where the means for depositing a sealant proximate the third through-hole may include: means for patterning a dry film resist layer proximate the third through-hole and extending beyond the periphery of the second through-hole.

Example 20 may include elements of any of examples 16 through 19 where the means for at least partially filling the third through-hole with a conductive paste that includes one or more electrically conductive materials further may include: means for at least partially filling the third through-hole with a conductive paste that includes the one or more electrically conductive materials and one or more electrically non-conductive materials.

Example 21 may include elements of any of examples 16 through 20 and the method may additionally include: means for depositing a filler material in the first through-hole.

Example 22 may include elements of any of examples 16 through 21 and the method may additionally include: means for grinding the conductive paste to a defined level measured with respect to the surrounding magnetic material; and means for curing the conductive paste.

Example 23 may include elements of any of examples 16 through 22 and the method may additionally include: means for depositing a metal layer across the conductive paste in the third through hole and the filler material in the first through-hole.

Example 24 may include elements of any of examples 16 through 23 and the method may additionally include: means for etching at least a portion of the metal layer to expose at least a portion of the substrate such that a first conductive pad coupled to the filler material in the first through-hole and a second conductive pad coupled to the conductive paste in the third through-hole both extend a distance from at least the upper surface of the substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A method of forming a through-hole lined with a magnetic material, comprising:
    forming a first through-hole in a substrate having an upper surface and a lower surface;
    forming a second through-hole in the substrate;
    filling the second through hole with a magnetic material such that an upper surface of the magnetic material is flush with the upper surface of the substrate and a lower surface of the magnetic material is flush with the lower surface of the substrate;
    forming a third through-hole in the magnetic material, the third through-hole extending from the upper surface of the magnetic material to the lower surface of the magnetic material;
    sealing the third through-hole on the upper surface and the lower surface of the magnetic material using a sealant that extends beyond the periphery of the second through-hole, the sealant disposed on at least a portion of an upper surface and the lower surface of the magnetic material;
    depositing a first metal layer on at least a portion of the substrate and in at least a portion of the first through-hole with the sealant deposited on the magnetic material;
    stripping the sealant from the upper surface and the lower surface of the magnetic material to expose the magnetic material and the third through-hole;
    at least partially filling the exposed third through-hole with a conductive paste that includes one or more electrically conductive materials;
    grinding the conductive paste; and
    curing the conductive paste at a temperature less than a glass transition temperature of the substrate.

2. The method of claim 1 wherein filling the exposed third through-hole with the conductive paste that includes the one or more electrically conductive materials includes:
    at least partially filling the exposed third through-hole with the conductive paste that includes the one or more electrically conductive materials and one or more non-electrically conductive materials.

3. The method of claim 1 wherein at least partially filling the exposed third through-hole with the conductive paste that includes the one or more electrically conductive materials further comprises:
    at least partially filling the exposed third through-hole with the conductive paste that includes the one or more electrically conductive materials using a wet process deposition.

4. The method of claim 1, further comprising:
    depositing a second metal layer proximate the conductive paste and proximate at least a portion of the first metal layer.

5. The method of claim 4, further comprising:
etching at least a portion of the first metal layer and the second metal layer to expose at least a portion of the substrate.

6. The method of claim 1 wherein forming the third through hole in the magnetic material comprises:
forming the third through hole in the magnetic material wherein the first through-hole comprises a through-hole having a first diameter and the third through hole comprises a through-hole having the first diameter.

7. The method of claim 1 wherein sealing the through-hole on the upper surface and the lower surface of the magnetic material using the sealant comprises:
patterning a thin film resist material proximate the upper surface of the magnetic material and proximate the lower surface of the magnetic material.

8. A method of forming a through-hole lined with a magnetic material, comprising:
forming a first through-hole having a first diameter through a substrate having an upper surface and a lower surface;
depositing a magnetic material in a second through-hole having a second diameter larger than the first diameter that extends from the upper surface of the substrate to the lower surface of the substrate;
forming a third through-hole through the magnetic material, the third through-hole having the first diameter;
depositing a sealant proximate the third through-hole, the sealant extending beyond the periphery of the second through-hole, the sealant proximate the upper surface of the substrate and proximate the lower surface of the substrate;
performing one or more wet chemistry processes on the substrate with the sealant deposited proximate the third through-hole;
removing the sealant to expose the third through-hole; and
at least partially filling the exposed third through-hole with a conductive paste that includes one or more electrically conductive materials.

9. The method of claim 8 wherein performing the one or more wet chemistry processes on the substrate comprises:
performing at least one of: a desmear wet chemistry process or a metal deposition wet chemistry process.

10. The method of claim 9 wherein performing the metal deposition wet chemistry process comprises:
performing an electroless plating wet chemistry process.

11. The method of claim 8 wherein depositing the sealant proximate the third through-hole comprises: patterning a dry film resist layer proximate the third through-hole and extending beyond the periphery of the second through-hole.

12. The method of claim 8 wherein at least partially filling the exposed third through-hole with the conductive paste that includes the one or more electrically conductive materials further includes:
at least partially filling the exposed third through-hole with the conductive paste that includes the one or more electrically conductive materials and one or more electrically non-conductive materials.

13. The method of claim 12, further comprising:
depositing a filler material in the first through-hole.

14. The method of claim 13, further comprising:
depositing a metal layer across the one or more electrically conductive materials in the third through hole and the filler material in the first through-hole.

15. The method of claim 14, further comprising:
etching at least a portion of the metal layer to expose at least a portion of the substrate such that a first conductive pad coupled to the filler material in the first through-hole and a second conductive pad coupled to the one or more electrically conductive materials in the third through-hole both extend a distance from at least the upper surface of the substrate.

* * * * *